United States Patent [19]
Xi et al.

[11] Patent Number: 5,982,309
[45] Date of Patent: Nov. 9, 1999

[54] PARALLEL-TO-SERIAL CMOS DATA CONVERTER WITH A SELECTABLE BIT WIDTH MODE D FLIP-FLOP M MATRIX

[75] Inventors: Xiaoyu Xi; William C. Black, Jr., both of Ames, Iowa

[73] Assignee: Iowa State University Research Foundation, Inc., Ames, Iowa

[21] Appl. No.: 09/005,080

[22] Filed: Jan. 9, 1998

[51] Int. Cl.[6] .................................................. H03M 9/00
[52] U.S. Cl. ........................................................ 341/101
[58] Field of Search ................................... 341/100, 101; 375/360, 361; 324/401.24; 326/93

[56] References Cited

U.S. PATENT DOCUMENTS

| | | | |
|---|---|---|---|
| 4,901,076 | 2/1990 | Askin et al. | 341/100 |
| 5,055,842 | 10/1991 | Mueller | 341/100 |
| 5,247,652 | 9/1993 | Uda | 395/500 |
| 5,319,369 | 6/1994 | Major et al. | 341/101 |
| 5,379,038 | 1/1995 | Matsumoto | 341/101 |
| 5,648,776 | 7/1997 | Widmer | 341/100 |
| 5,654,707 | 8/1997 | Matsumoto | 341/101 |
| 5,774,079 | 7/1998 | Zirngibl | 341/100 |
| 5,798,720 | 8/1998 | Yano | 341/101 |

*Primary Examiner*—Brian Young
*Attorney, Agent, or Firm*—Dwight N. Holmbo

[57] ABSTRACT

A high-speed parallel-to-serial CMOS data transmitter uses a D Flip-flop matrix architecture to combine a shift scheme with a selection scheme to serialize parallel bit data. Data is partially serialized through multi data paths at a much lower frequency and a time-division multiplex scheme selects one bit from each data path allowing for pipelined data processing. The CMOS architecture uses selective load clock mode switching allowing different word bit widths to be processed simply by adjusting the frequency of a loading clock.

29 Claims, 14 Drawing Sheets

PARALLEL-TO-SERIAL CMOS DATA CONVERTER WITH A SELECTABLE BIT WIDTH MODE D FLIP-FLOP M MATRIX

BACKGROUND OF THE INVENTION

1. Field of the Invention

This present invention relates generally to high-speed data converters, and more particularly to a high-speed parallel-to-serial CMOS data converter having a D flip-flop Matrix structure that can selectively convert a plurality of predetermined bit widths simply by adjusting the frequency of a loading clock.

2. Description of the Prior Art

The parallel-to-serial data converter is an important functional structure in many data transmitters. Basically, it latches the parallel input words and converts those words into a serial data sequence, precisely timed via a transmitting clock. For most applications, especially high-speed data links such as fibre channel and Gigabit Ethernet, a differential data stream is preferred since it helps to improve signal-to-noise (S/N) ratio, depress noise caused by switching drivers, and minimizes cross-talk.

Various parallel-to-serial data converter structures and associated methods of control have been suggested at one time or another, but in each instance, these structures leave something to be desired. For example, there is a need for an inexpensive parallel-to-serial data converter, i.e. using CMOS technology, that is capable of efficiently and reliably operating at Gigabit speeds and that allows a plurality of desired bit widths to be processed without requiring modifications to the existing converter structure. Converters are available that are suitable for use at Gigabit speeds, but generally such converters have been available only with expensive technologies such as GsAs or silicon bipolar.

One conventional implementation of a parallel-to-serial converter suitable for performing such a conversion includes a chain of D flip-flops that operate via a shift scheme such as disclosed in U.S. Pat. No. 5,654,707, issued Aug. 5, 1997 to Matsumoto entitled Parallel-To-Serial Data Conversion Circuit; U.S. Pat. No. 5 5,379,038, issued Jan. 3, 1995 to Matsumoto entitled Parallel-Serial Data Converter; and U.S. Pat. No. 5,247,652, issued Sep. 21, 1993 to Uda entitled Parallel To Serial Converter Enabling Operation At A High Bit Rate With Slow Components By Latching Sets Of Pulses Following Sequential Delays Equal To Clock Period. However, the aforesaid shift scheme has inherently unavoidable drawbacks that include: 1) All the D flip-flops in the chain work at the full data rate; hence the dynamic power dissipation is considerably large according to the high-speed data transition; 2) The single bit clock must necessarily drive all the D flip-flops, in which case the load is very large and brings difficulties for designing the clock driver; 3) The VCO generating the bit clock has to work at the data rate frequency, which is not easy to achieve at Gigabit levels; and 4) High-speed flip-flops are absolutely necessary to achieve a satisfactorily workable configuration which further challenges the final design. In consideration of the foregoing, it is not preferable to use a pure shift scheme in Gigabit applications.

An alternative implementation to the aforesaid shift scheme includes a selection scheme wherein all of the D flip-flops are put in parallel, with a switch added at each output port. Generally, a bus connects the outputs of the switches together to serialize the output data. Such configurations can extend to multi-levels, creating a tree-like data path. The selection scheme requires more clock signals and more complicated logic support than that required of shift schemes, but has benefits that include: 1) The D flip-flops will work at the much lower parallel data rate and the constrains for its design can be loosened; 2) The VCO need not work at the serial data rate which also eases the design constraints; and 3) Each switch is driven by a single clock phase so that the total load is distributed equally to the multi-phase clocks. However, a purely selection scheme will require many clock phases for a wide word, necessitating use of a VCO comprising many stages. Additionally, multi-phase clocks are not flexible for use with variable bit widths because the phase number necessarily must equal the word bit width.

Thus, prior known selection and shift conversion schemes taken individually are not suitable to accommodate high data rate parallel-to-serial conversion. In view of the above, a need exists in the art for an inexpensive parallel-to-serial converter having a simple clock architecture that is capable of efficiently and reliably converting data words of selectable bit widths at high bit rates.

SUMMARY OF THE INVENTION

The limitations of the background art discussed herein above are overcome by the present invention which includes a CMOS parallel-to-serial converter especially suitable for use in high-speed data links such as fibre channel and Gigabit Ethernet. The novel parallel-to-serial converter yields a differential data stream thereby improving signal to noise (S/N) ratios, depressing noise caused by switching drivers and minimizing crosstalk. Preferably, the aforesaid differential serial output yields a signal swing that matches the input of a differential line driver. The CMOS architecture employed includes use of true-single-phase-clock (TSPC) D flip-flops as basic cells to construct a D flip-flop matrix. The size of the matrix is dependent upon the desired word bit width to be transmitted. The aforesaid D flip-flop matrix uniquely combines both shift and selection conversion schemes to efficiently and reliably accommodate high data transmission rates while simultaneously allowing switching modes to be altered so as to selectively permit changes in the data word bit width to be varied as desired. Convenient switching between one bit width mode and another bit width mode is accomplished simply by adjusting the frequency of a loading clock as contrasted with changing the phase number of the clocks such as done with more conventional schemes. The novel CMOS architecture allows pipelined data loading of the parallel-to-serial converter using a set of carefully arranged clocks created from a multi-stage differential ring oscillator much like the sequentially generated stage output signals created by the ring counter disclosed in U.S. Pat. No. 4,901,076, issued Feb. 13, 1990 to Askin et al. entitled Circuit For Converting Between Serial And Parallel Data Streams By High Speed Addressing. Single clock triggering of the D flip-flops is carefully accomplished in reverse order (last to first) to ensure earlier D flip-flops in each path are not overloaded by later stages. RC delays associated with polysilicon are reduced with strategically placed metallic strips and polysilicon contacts to yield the novel parallel-to-serial converter in the form of an Application Specific Integrated Circuit (ASIC).

It is a feature of the present invention that a CMOS parallel-to-serial data converter that is provided with a D flip-flop matrix core, incorporates desirable features associated with both selection and shift conversion schemes.

It is another feature of the present invention that a combination selection and shift parallel-to-serial converter is provided with a variable frequency loading clock that accommodates switching mode changes within the converter thereby allowing the converter to selectively function with a variety of different word bit widths as desired.

It is still another feature of the present invention that a CMOS parallel-to-serial converter is provided with a D flip-flop matrix and a single multi-stage differential ring oscillator adapted to generate all necessary converter clock signals.

It is yet another feature of the present invention that a CMOS parallel-to-serial converter is provided with a D flip-flop matrix selectively comprising either a true single phase clock ratioed logic that operates efficiently and reliably under environmental and temperature extremes or a conventional ratioless CMOS logic that operates with no static power dissipation.

BRIEF DESCRIPTION OF THE DRAWINGS

Other features of the present invention and many of the attendant advantages of the present invention will be readily appreciated as the same becomes better understood by reference to the following detailed description when considered in connection with the accompanying drawings in which like reference numerals designate like parts throughout the figures thereof and wherein.

While the above-identified drawing figures set forth alternative embodiments, other embodiments of the present invention are also contemplated, as noted in the discussion. In all cases, this disclosure presents illustrated embodiments of the present invention by way or representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
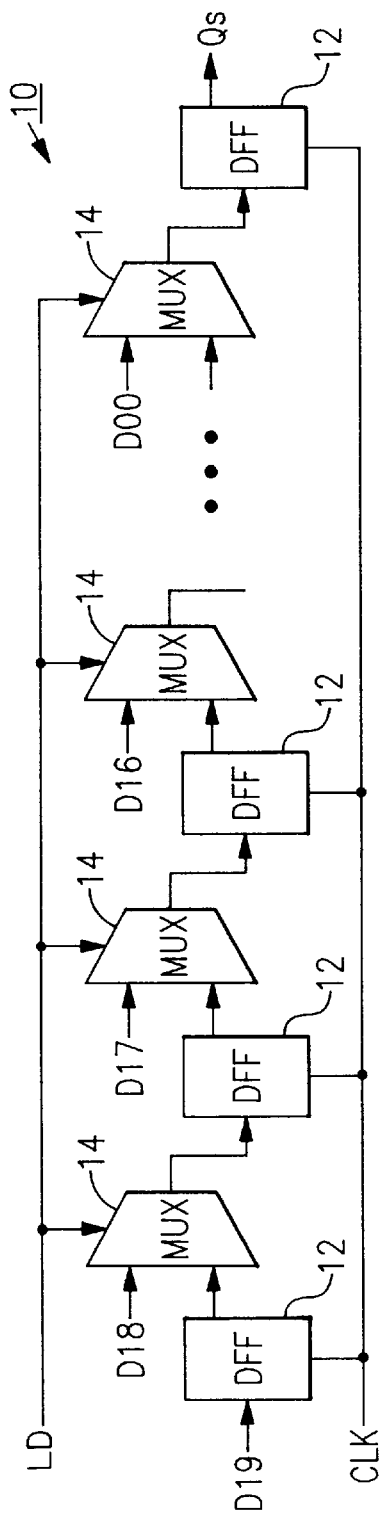
FIG. 1 is a simplified schematic diagram illustrating a structure for a parallel-to-serial converter utilizing a shift scheme.
Figure 2:
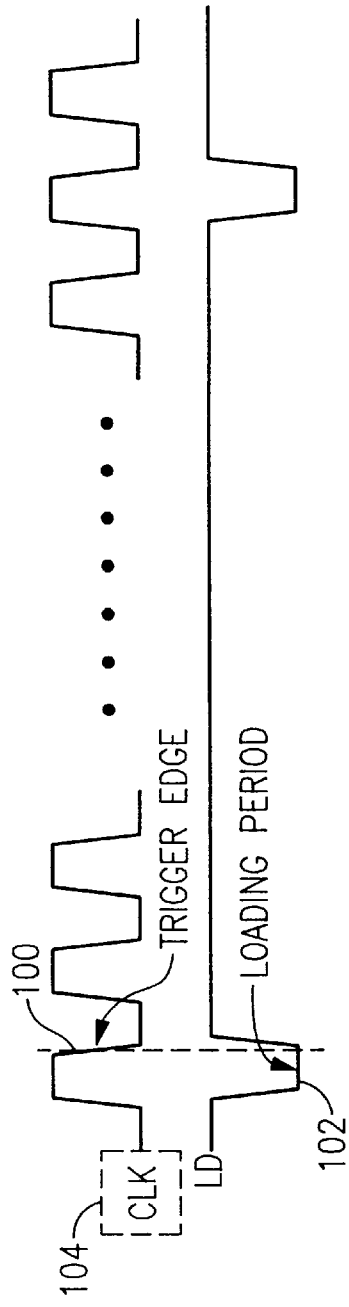
FIG. 2 is a timing diagram illustrating the trigger and load clock timing relationships for the parallel-to-serial converter depicted in FIG. 1.

The preferred embodiments described as follows, address the long felt need by those in the data and telecommunications industries to provide an inexpensive parallel-to-serial data transmitter capable of creating a differential data stream that is suitable for use with high-speed data links such as fibre channel and Gigabit Ethernet. With particular attention being directed to FIG. 1, a simplified block diagram illustrating one embodiment for a parallel-to-serial converter 10, using a chain of D Flip-flops 12 to perform the data conversion. Parallel level one latches (not shown) are commonly added to sample and hold the input data for the converter 10. The 2-to-1 multiplexers 14 control the input source for each D Flip-flop 12, which can be either the parallel data from the level one latches or the shifted output from the previous stage. This type of parallel-to-serial converter 10 utilizes precisely controlled timing relationships between the clocks for parallel loading and serial shifting such as illustrated in FIG. 2. Typically, the clock trigger (shifting) edge 100 is offset near the end of the data loading period 102. The aforesaid shift scheme illustrated in FIGS. 1 and 2 results in a simple logic structure that requires less clock signals than required of other parallel-to-serial conversion schemes. Thus, data shifting schemes may be reasonably considered for high-speed applications. However, shifting schemes have inherently unavoidable drawbacks. Some of these drawbacks include: 1) all D Flip-flops 12 in the chain work at the full data rate; hence the dynamic power dissipation is considerably large according to the high-speed data transition; 2) the single bit clock 104 must necessarily drive all the D Flip-flops 12 in the chain, in which case the load is very large and creates substantial difficulties when creating the required clock 104 driver; 3) the VCO generating the bit clock 104 must necessarily work at the data rate frequency, which is difficult to achieve at gigabit levels; and 4) high-speed D Flip-flops 12 are absolutely necessary to implement the aforesaid shifting configurations, which further challenges the overall design. Taking the above into consideration, the present inventors have found that it is not preferable to use a pure shifting scheme in gigabit applications.

Figure 3:
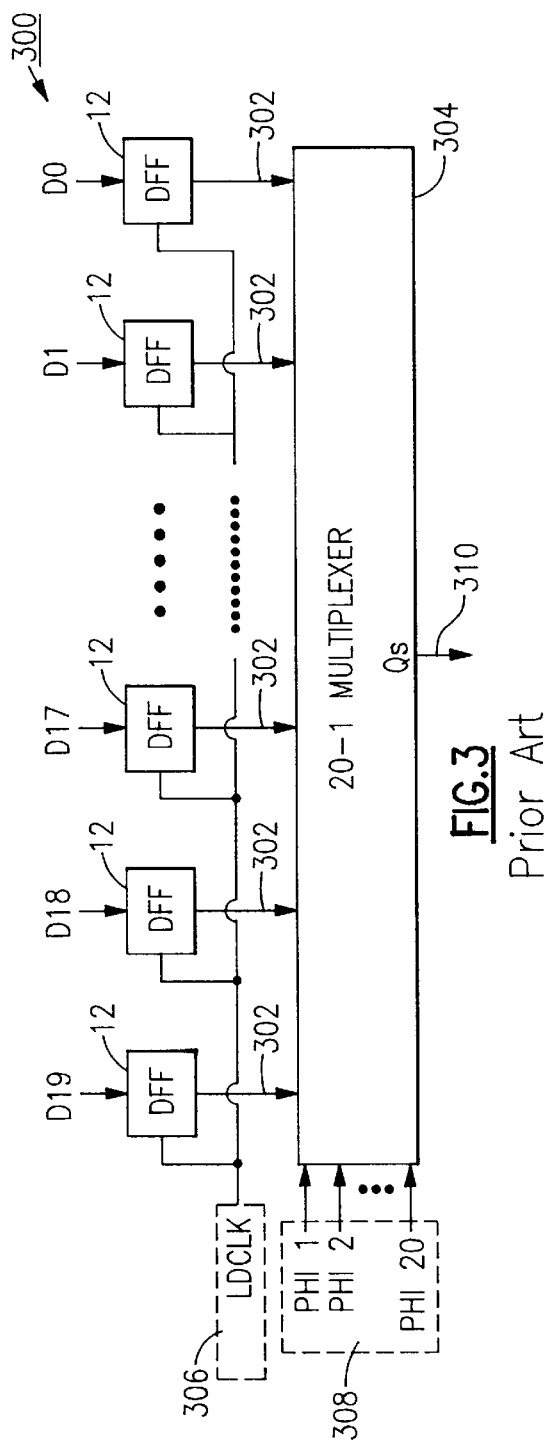
FIG. 3 is a simplified schematic diagram illustrating yet another structure for a parallel-to-serial converter, but that utilizes a selection scheme.
Figure 4:
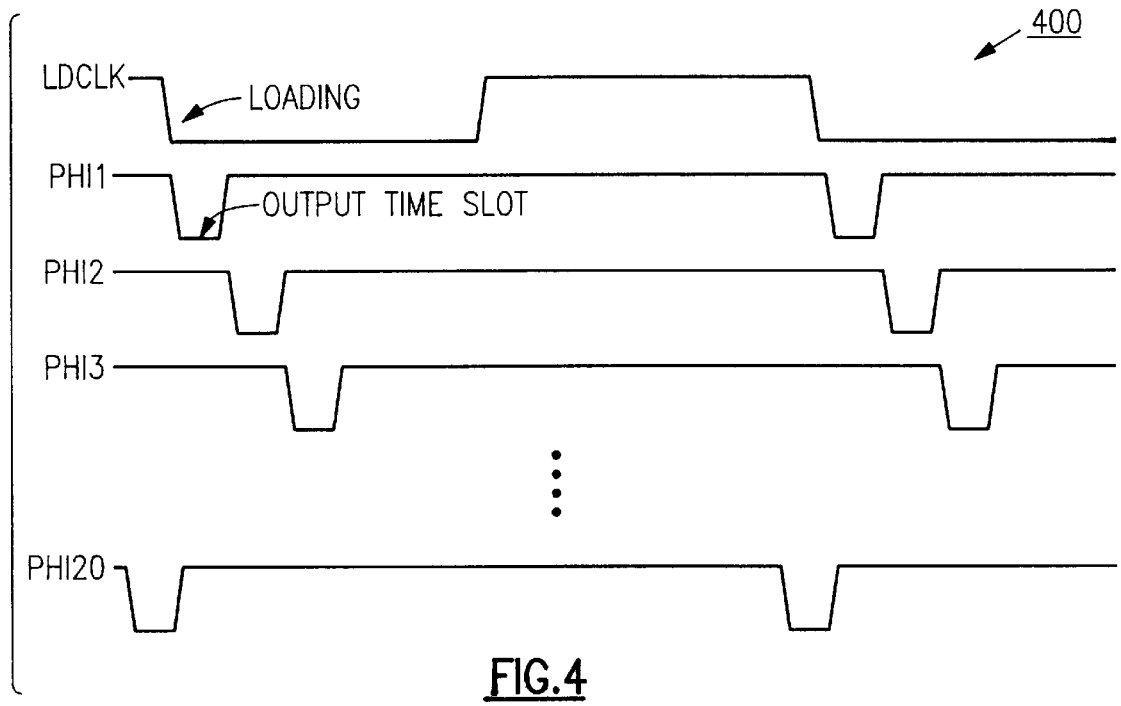
FIG. 4 is a timing diagram illustrating the phase and load clock timing relationships for the parallel-to-serial converter depicted in FIG. 3.

FIG. 3 illustrates a parallel-to-serial data converter 300 using a selection scheme, that is an alternative solution to the shifting scheme discussed herein above. This selection scheme utilizes D Flip-flops 12 connected in parallel, each having an output port 302. The selection scheme connects the output ports 302 in a configuration to serialize the input data (D0–D19). This configuration can extend to multilevels so that a tree-like data path may be formed in a manner familiar to those skilled in the art. A timing diagram illustrating one preferred timing relationship between the load clock 306 and the multi-phase clock 308 is shown in FIG. 4. Those skilled in the art will readily appreciate that level one latches can just as well be added prior to the parallel-to-serial converter 300 shown in FIG. 3. The multiplexing scheme is controlled by the multi-phase clock 308 output pulses. A parallel word (e.g. D0–D19) can be loaded from the aforesaid level one latches into the parallel D Flip-flops 12, at which time the multi-phase clock 308 will activate the switches one by one to generate the corresponding bit (e.g. D0–D19) at the output port 310. This technique is also known as time division multiplexing and finds popular applications in high-speed transceivers. It will readily be appreciated that the loading clock 306 and the selecting clock (multi-phase clock) must necessarily be precisely synchronized to ensure that most recent loading data will not degrade, destroy, or otherwise impair the last output bit. As stated herein before, FIG. 4 exemplifies a set of clock signals 400 arranged to satisfy the aforesaid timing requirements between the load clock 306 and the multi-phase clock 308. The foregoing selection scheme requires more clock signals and more complicated logic than the shifting scheme described herein before. However, the selection scheme ensures that: 1) the D Flip-flops 12 will work at the much lower parallel data rate and the design constraints can therefore be loosened; 2) the VCO need not work at the serial data rate, which also eases the aforesaid design constraints; and 3) each switch is driven by one clock phase so that the total load is distributed equally among each phase of the multi-phase clock. However, it will readily be appreciated that a pure selection scheme will necessarily require many clock phases for a wide word, rendering a VCO having many stages necessary for implementation. Additionally, multi-phase clocks are not sufficiently flexible to accommodate a variation in bit width since the phase number must necessarily equal the word bit width.

Figure 5:
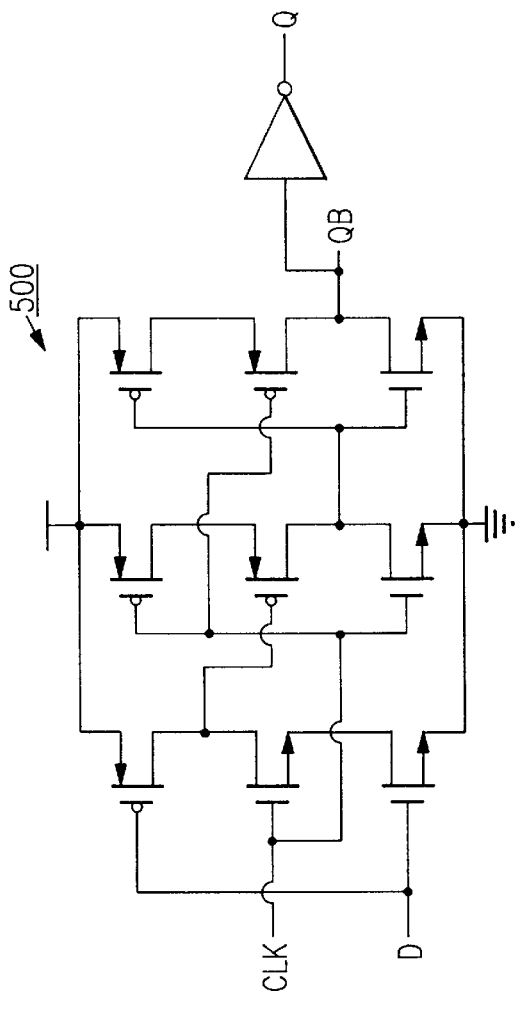
FIG. 5 is a simplified schematic diagram illustrating one embodiment for a true single phase clock (TSPC) D flip-flop.

Though the conversion scheme could be different, the most common cell for implementing a parallel-to-serial converter is the D Flip-flop. The design and optimization of high-speed D Flip-flop cells has been continuously investigated because of their importance as a building block for digital circuits. Dynamic D Flip-flops dominate high frequency applications. One popular architecture is the Yuan-Svenssen True-Single-Phase-Clock (TSPC) D Flip-flop 500 illustrated in FIG. 5. One major advantage of this D Flip-flop 500 is that it only requires one clock signal, as contrasted with conventional D Flip-flops which require complementary clocks to drive the master and slave stage respectively. Therefore, the TSPC strategy inherently avoids the clock skew except for delay problems normally associated with conventional D Flip-flops, making the TSPC D Flip-flops 500 more desirable in higher frequency applications. However, this type of D Flip-flop 500 is somewhat disadvantageous at high frequencies because of its inherent sensitivity to the slope of the clock signals which can result in destruction of output data due to a poor triggering clock edge.

Figure 6:
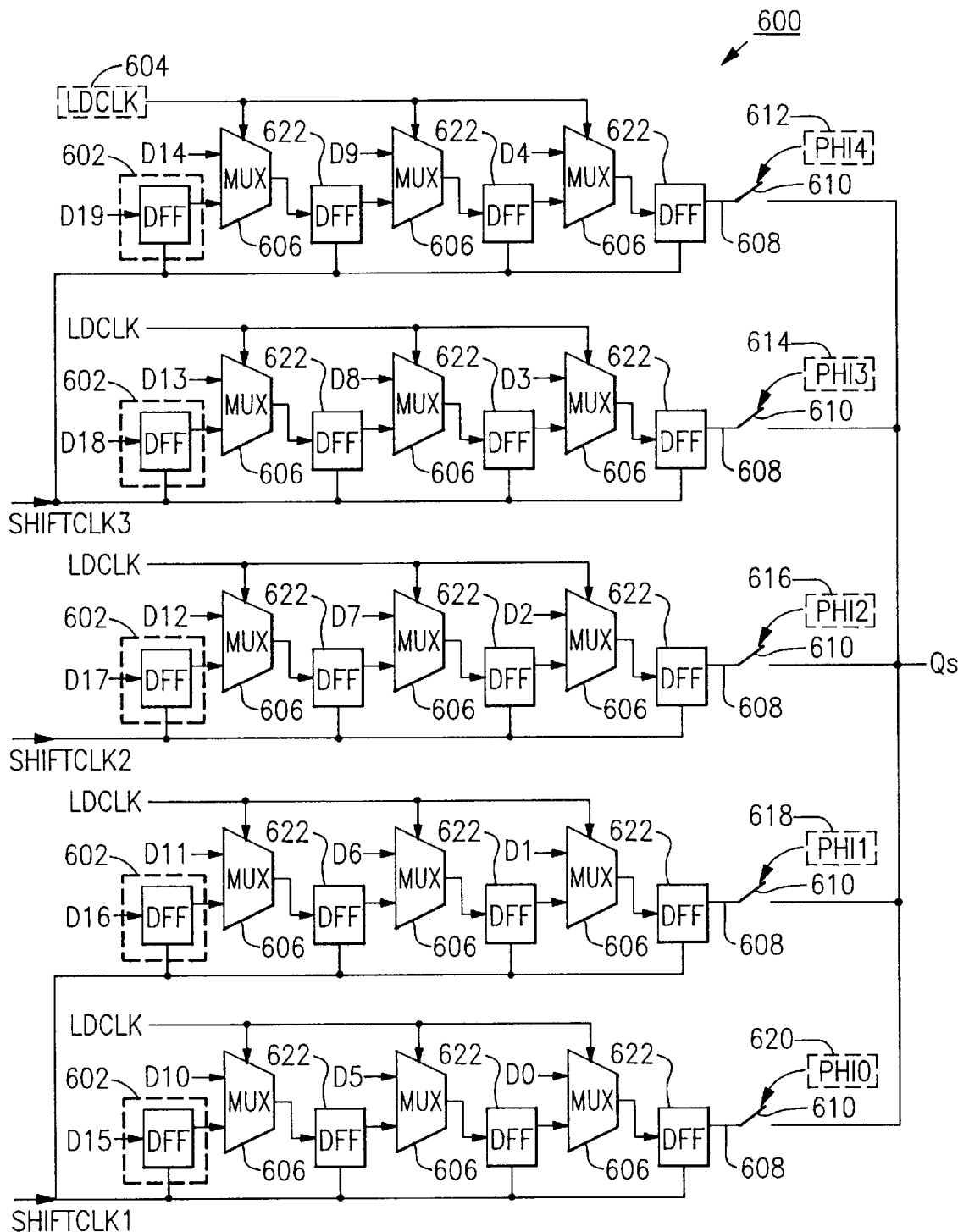
FIG. 6 is a simplified schematic diagram illustrating one embodiment of a D Flip-flop matrix architecture suitable to accomplish parallel-to-serial data signal conversion in conformance with the present invention.

Moving now to FIG. 6, a selective dual mode 20/10 bit wide parallel-to-serial converter 600 incorporating a D Flip-flop matrix in accordance with one preferred embodiment of the present invention is depicted. As stated herein before, high-speed data rates present significant challenges to the shift scheme; and the 20/10 bit dual mode makes the generation of variable-phase clocks more complicated. Therefore, use of either a shifting or selective scheme presents problems rendering either scheme alone unsuitable for use at the aforesaid high-speed data rates. A solution to the foregoing problems is provided by the novel parallel-to-serial converter 600 shown in FIG. 6. The core circuit for the embodiment shown is a 5 row by 4 column D Flip-flop matrix 600. It will readily be appreciated that although a 5 row by 4 column is shown in FIG. 6, other row/column combinations, i.e. 10×2, 2×10, utilizing the same principles will also work equally well to accommodate 10/20 bit operation. It is noteworthy that the left most D Flip-flops 602 in each row can be omitted if replaced with level one latches (enumerated as 1102 in FIG. 11) as discussed herein before. The present inventors have found it preferable to use such level one latches to accomplish the desired high-speed data conversion.

The novel parallel-to-serial converter 600 allows convenient switching between the 20 bit mode and the 10 bit mode, simply by adjusting the frequency of the loading clock 604 which controls the multiplexers 606. This unique multi-mode switching scheme can be contrasted with known converter schemes that require the number of the phase clocks to change to accommodate controlling the appropriate number of output switches required to allow multi-mode operation. In the 20 bit mode, all serial bits on each data path 608 are shifted out. In the 10 bit mode, the two right most bits on each data path 608 are shifted out, while the two left most bits are overloaded by new data. Thus, the two aforesaid modes of 20 bit or 10 bit can be easily switched by selecting the proper loading clock 604 frequency. The embodiments of the present invention shall be discussed hereinafter with reference to particular operating frequencies to simplify the discussion. However, the present invention is not so limited, and the novel principles can also be applied to converters operating at other frequencies. The present inventors designed the parallel-to-serial converter 600 to operate at a data rate of 1 gigabit per second (Gbps). This was accomplished by creation of a 5-row by 4-column D Flip-flop matrix converter 600 allowing each data path 608 to operate at a frequency of 200 MHz. The output switches 610 are controlled by a 5-phase clock that generates 5 different phase pulses 612, 614, 616, 618, 620. The present inventors found a phase pulse width of 1 nanosecond at 200 MHz sufficient to cycle the output switches 610 and accommodate an equivalent data rate of 1 Gbps. This technique requires only the output drivers (shown in FIGS. 14–17 and 23) to operate at the full data rate. The lower frequency (200 MHz) on each data path 608 ensures fewer data transitions thereby reducing the dynamic power dissipation by a factor of 5 for the presently shown embodiment. The foregoing scheme has the added advantage of allowing pipelined data loading into the converter 600. Pipelined loading however, requires a set of carefully arranged clocking pulses. The present inventors found the clock set illustrated in FIG. 7 workable to accomplish the aforesaid pipelined loading of data. The multiplexers 606 for the converter 600 were each implemented with a single NMOS pair rather than more conventional complementary transmission gates, thus requiring a simpler control clock. Although the resulting multiplexer output signal is not full CMOS logic, the present inventors found that the resulting output signal could be recovered by the following D Flip-flop 622.

Figure 7:
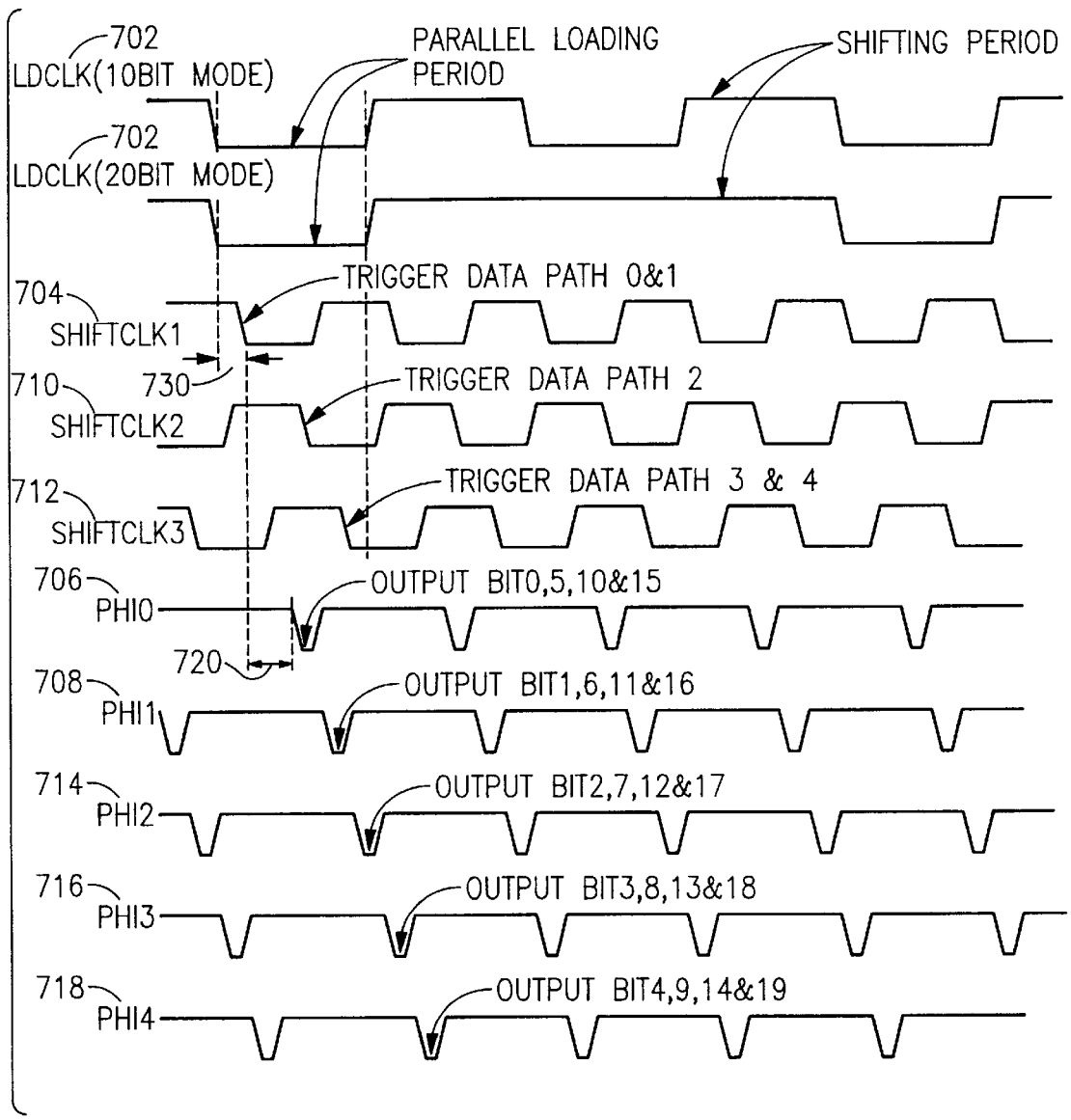
FIG. 7 is a timing diagram illustrating timing relationships between the load clocks, shift clocks and the phase clocks suitable for use with the parallel-to-serial converter architecture shown in FIG. 6.

Looking again at FIG. 7, LDCLK 702 and its complementary LDCLKbar (FIG. 10) control the multiplexer 606 between each D Flip-flop 622. While LDCLK 702 is low, the parallel loaded data passed through its respective multiplexer 606 where the data reaches the input of its respective D Flip-flop 622. While LDCLKbar is low, the data shifted by the previous D Flip-flop 622 passes through its respective multiplexer 606 where the data reaches the input of the next D Flip-flop 622.

With continued reference to FIG. 7, a clear description of the foregoing working scheme can be demonstrated by assuming that the D Flip-flops 622 are negative edge triggered. For example, it can be seen that the negative edge of SHIFTCLK1 (704) leads the phase0 pulse 706 and the phase1 pulse 708 by a certain time interval when SHIFTCLK1 (704) is applied to the lowest two data paths. This clocking strategy guarantees the shifted and/or selected data is stable at the output of its respective D Flip-flop 622 prior to its selection onto the output data bus. Similarly, application of SHIFTCLK2 (710) to the middle data path and SHIFTCLK3 (712) to the top two data paths, likewise ensure each shift clock pulse leads its corresponding phase clock pulses by a preset time interval thereby improving the reliability of converter 600 operation.

Figure 8:
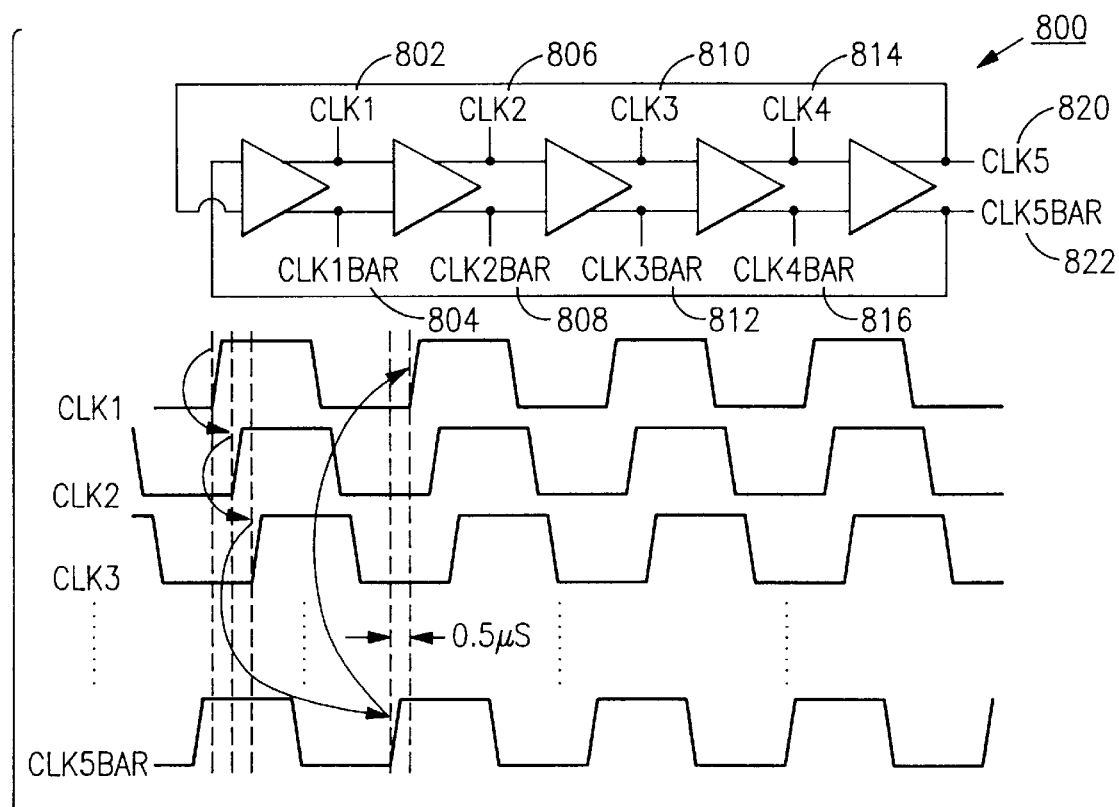
FIG. 8 is a simplified schematic diagram illustrating a ring oscillator suitable for implementing phase clocks suitable for use with the parallel-to-serial converter architecture shown in FIG. 6.
Figure 9:
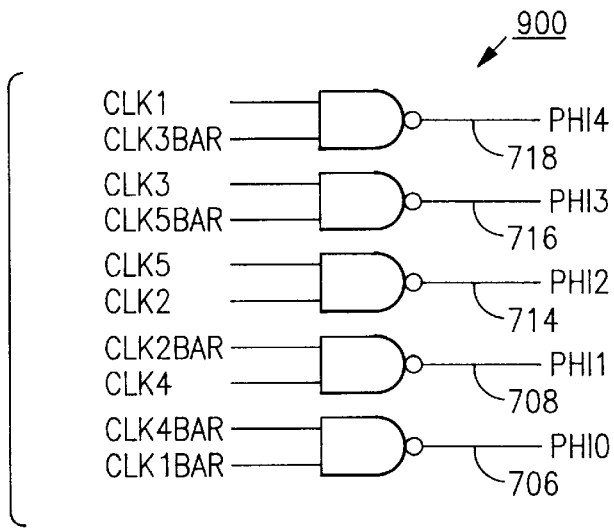
FIG. 9 is a simplified schematic diagram illustrating a logic structure suitable for use with the ring oscillator shown in FIG. 8 to generate phase pulses suitable for use with the parallel-to-serial converter architecture shown in FIG. 6.

Moving now to FIGS. 8 and 9, a 5-stage differential ring oscillator 800 and a group of associated NAND gates 900 were combined by the present inventors to generate all the phase clock pulses 706, 708, 714, 716, 718 shown in FIG. 7. It can be easily seen that all the phase clock pulses 706, 708, 714, 716, 718 can be generated without difficulty simply by sending appropriate clock signals 802–822 from the ring oscillator 800 to a respective NAND gate 900 as depicted in FIG. 9 so that the herein before described 1ns wide negative pulses are generated. It will readily be appreciated that the present invention is not limited to use with the foregoing implementation of a clocking scheme and that many other clocking schemes could also be used to generate the desired phase clock pulses 706, 708, 714, 716, 718, so long as the necessary reliability and timing requirements are maintained.

Figure 10:
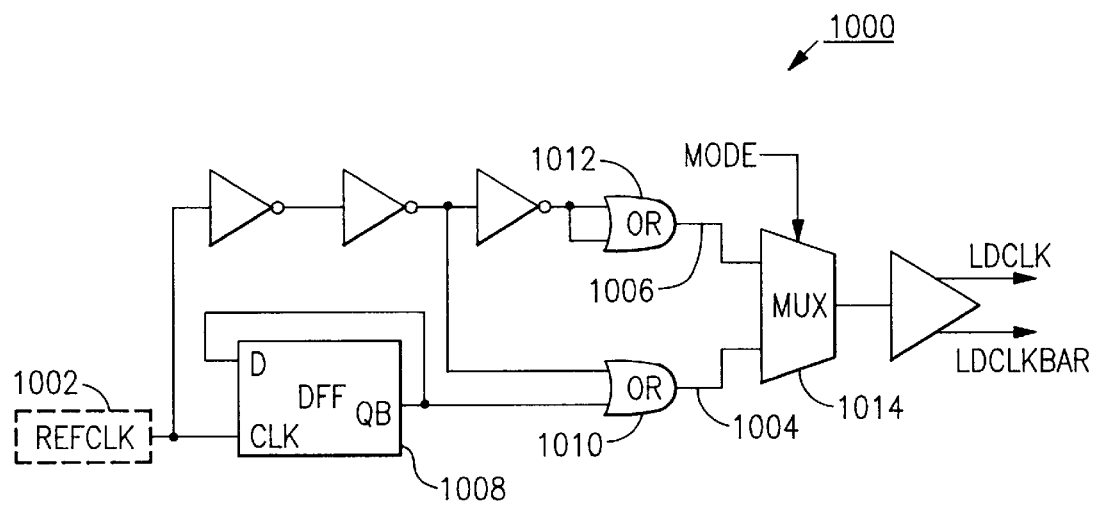
FIG. 10 is a simplified schematic diagram illustrating a logic structure suitable for generating load clock pulses suitable for use with the parallel-to-serial converter architecture shown in FIG. 6.

Those skilled in the art will appreciate that the shifting clocks 704, 710, 712, can be implemented from the ten phase clocks 802–822 generated by the ring oscillator 800, so long as they are well synchronized with the loading clock 604, 702. The present inventors found that only a 50 MHz or a 100 MHz loading clock could achieve reliable working results for the 20/10 bit dual mode parallel-to-serial converter 600. One preferred implementation of a loading clock 1000 suitable for use with the converter 600 is shown in FIG. 10. The reference clock (REFCLK) 1002, normally supplied externally, is a 100 MHz clock optionally obtained either by dividing one of the 10 phase clocks 802–822 shown in FIG. 8 or the 5 phase pulses 706, 708, 714, 716, 718 shown in FIG. 7. Within the reference clock 1002, there are two signal paths 1004, 1006. Signal path 1004 is further divided to generate the herein before referenced 50 MHz clock. Signal path 1006 includes simple inverter stages to compensate the delay introduced by the divider 1008. The 50 MHz loading clock having a 75% duty cycle (shown as 20 bit mode in FIG. 7) is achieved simply by sending the 100 MHz and the 50 MHz clock signals into an OR gate 1010. The top OR gate 1012 is added to the loading clock 1000 to cancel the signal delay between the two signal paths 1004, 1006 thereby ensuring the negative edge of the 50 MHz and the 100 MHz loading clocks are aligned as well as possible. The loading clock signals 702 then go into a 2-to-1 multiplexer 1014 that is controlled via a MODE signal to determine whether the 50 MHz or the 100 MHz clock functions to operate the converter 600.

Those skilled in the art will readily appreciate that precise synchronization of the loading clocks 702 with the shift clocks 704, 710, 712 and the phase clock (switch) pulses 706, 708, 714, 716, 718 require access to an accurate reference signal. The present inventors found that phase clock pulse0 (706), that controls the bit0, bit5, bit10 and bit15, provided suitably accurate working results. With continued reference to FIG. 7, it can be observed that the position of SHIFTCLK1 (704), that controls the lowest two data paths, can be determined by subtracting a small but large enough time interval 720. The SHIFTCLK2 (710) and SHIFTCLK3 (712) positions can subsequently be easily determined simply by adding the necessary 2 ns and 3 ns time delays referenced herein above. Finally, the position of the falling (negative) edge for both loading clocks 702 can likewise be determined by subtracting a second appropriate time interval 730 at the falling edge of SHIFTCLK1 (710). The minimum step adjustment achievable with the present embodiment was found by the present inventors to be 5 ns/10=0.5 ns, since this is the minimum time interval between each adjacent clock pulse 802–822 generated by the ring oscillator 800. Thus, the loading 702 and/or shift clocks 704, 710, 712 were accurately synchronized in 0.5 ns steps. Taking the above timing constraints into consideration, clk1 (802), clk5 (820) and clk2bar (808) were found by the present inventors to provide the working SHIFTCLK1 (704), SHIFTCLK2 (710) and SHIFTCLK3 (712) clocking pulses respectively. Finally, dividing the reference clock pulse0 (706) by 2, was found to generate a workable loading clock 702 for the present embodiment.

extremes. Table I illustrates transistor sizes utilized by the present inventors to formulate the core D Flip-flop 1200 structure employed by the parallel-to-serial converter 600.

TABLE I

Transistor Sizes for TSPC D Flip-flop 1200

| | MP1 | MP2 | MP3 | Mpbuf | MN0 | MN1 | MN2 | MN3 | Mnbuf |
|---|---|---|---|---|---|---|---|---|---|
| W/L($\mu$) | 2.4/0.6 | 1.8/0.6 | 3/0.6 | 9/0.6 | 2.4/0.6 | 2.4/0.6 | 3/0.6 | 3.6/0.6 | 5.4/0.6 |

Figure 11:
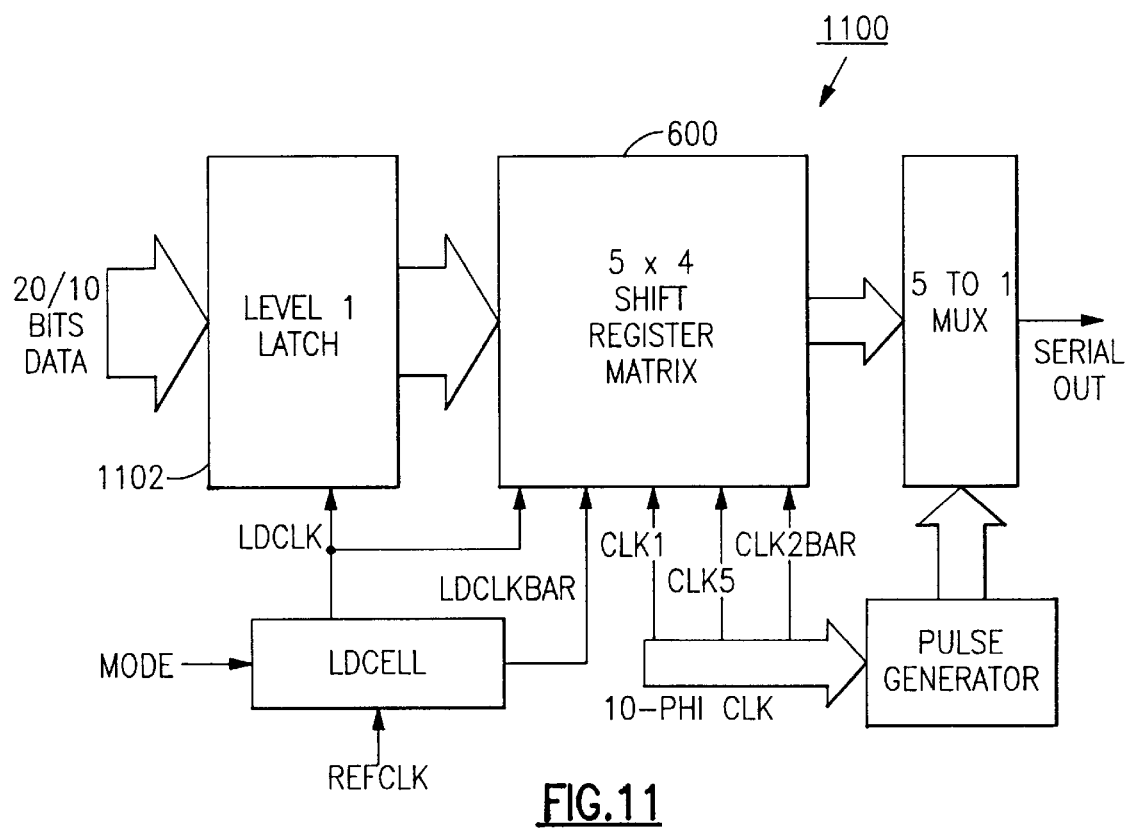
FIG. 11 is a simplified block diagram illustrating one preferred embodiment of a complete parallel-to-serial converter in accordance with the present invention and that utilizes the architecture and clocking arrangements illustrated in FIGS. 6–10.
Figure 12:
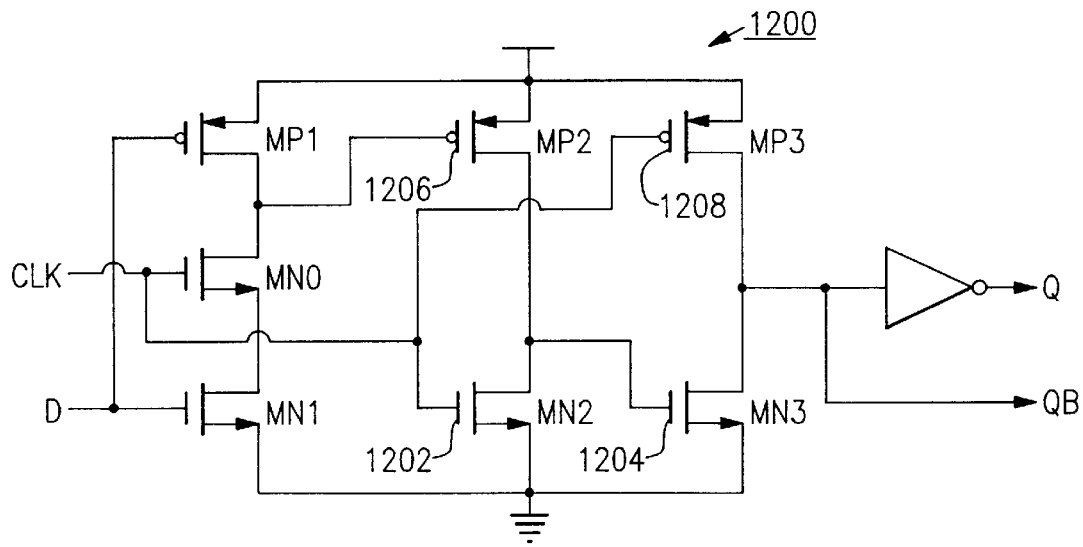
FIG. 12 is a simplified schematic diagram illustrating one preferred embodiment of a ratioed true-single-phase-clock (TSPC) D Flip-flop suitable for implementing the parallel-to-serial converter architecture depicted in FIG. 6 in accordance with the present invention.

FIG. 11 is a block diagram illustrating a complete novel parallel-to-serial data transmitter 1100 using the herein before described 5×4 Shift Register Matrix 600 including a level 1 latch 1102 to achieve the desired selective mode data conversion. Those skilled in the art of parallel-to-serial data conversion will appreciate that high performance, high-speed parallel-to-serial converters using D Flip-flops are limited by the reliability and speed characteristics of the aforesaid D Flip-flops. Various types of TSPC D Flip-flops are known in the art. Among them is the well known TSPC D Flip-flop 1200 disclosed by Byungsoo Chang, Joonbae Park and Wonchan Kim shown in FIG. 12. The present inventors found that D Flip-flop 1200 using ratioed logic worked best for high-speed applications where static power dissipation is of no importance, i.e. where the design margin allows for a greater overall power dissipation, since the ratioed Flip-flops described herein burn static power. The drains of MN2 (1202) and MN3 (1204) will be pulled low as long as a "high" signal is applied their gates, even though the gates of MP2 (1206) and MP3 (1208) may be pulled low. The trade-off paid for the aforesaid desired operational feature is some static power dissipation that is dependent upon the required data input rate. The advantage gained by this architecture is a structure that uses two less transistors than used in more conventional architectures, e.g. D Flip-flop 500 shown in FIG. 5. The architecture of D Flip-flop 1200 eliminates the series resistance associated with series MOS transistors, and thus inherently minimizes the time constant for charging and discharging the load capacitance, resulting in reduced delay, rise and fall times associated with the output data. The present inventors found D Flip-flop 1200 to be most preferable in the desired high-speed application, since the aforesaid delay, rise and fall times normally set the upper limit on the working frequency. The architecture employed by the present inventors for the parallel-to-serial converter 600 was found to provide a workable structure using D Flip-flops 1200 since the driving capability requirements of converter 600 are small. The use of D Flip-flops 1200 also reduced overall power dissipation for the converter 600. As stated herein above, D Flip-flop 1200 was formulated using ratioed logic for the present embodiment. As stated herein before, the ratioed Flip-flops described herein burn static power, and hence this component of the overall power dissipation is not reduced via the parallel scheme described above. Only the dynamic component of power is reduced. The present inventors believe that where the design margin is sufficient, the preferred embodiment would use ratioless Flip-flops, i.e. where there is no static power dissipation. For example, MN2 (1202) and MN3 (1204) were fabricated comparatively larger than MP2 (1206) and MP3 (1208) to ensure the ratioed logic performed well under different environmental and temperature The D Flip-flop 1200 was simulated at temperatures of 25° C. and 85° C. by the present inventors with the results shown in Table II herein below.

TABLE II

Simulated Specifications for TSPC D Flip-flop 1200

| | 25° C. | 85° C. |
|---|---|---|
| Delay | 290 ps for "0" to "1" | 380 ps for "0" to "1" |
| | 250 ps for "1" to "0" | 320 ps for "1" to "0" |
| Rise Time | 150 ps | 200 ps |
| Fall Time | 140 ps | 170 ps |
| Power Dissipation | 1 mW | 0.82 mW |

With reference to Table II, it can be observed that the delay, rise and fall times are small compared with the time intervals between loading clock pulses 702 and shift clock pulses 704, 710, 712, thereby ensuring that data will be valid at the output before further processing. It can also be seen the foregoing architecture and structural characteristics provide ample room for operating the D Flip-flop at higher data rates if so desired. The present inventors found it most preferable to use the same number of load clocks as the degree of parallelism (5 load clocks for a 5×4 matrix) to achieve optimum data transmission rates.

Figure 14:
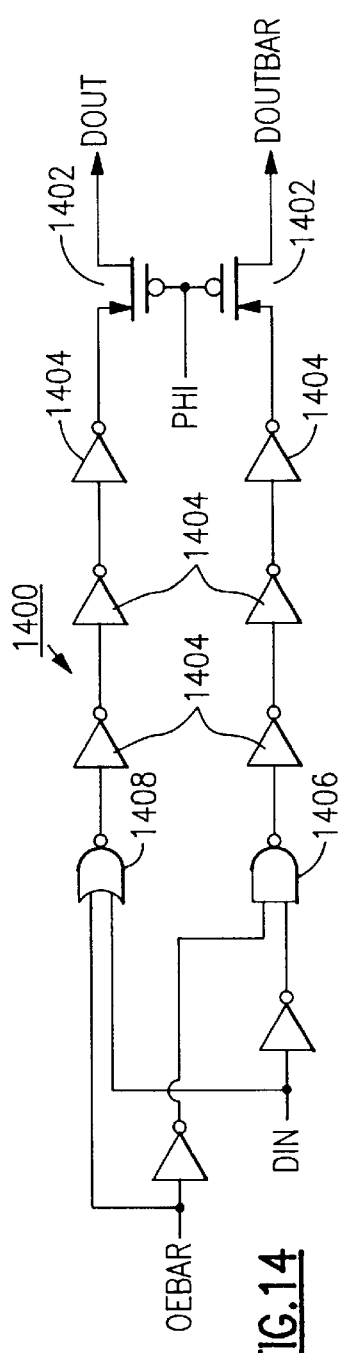
FIG. 14 is a simplified schematic diagram illustrating one embodiment of a 5 to 1 multiplexer architecture (with differential signals) suitable for use with the present invention to help accomplish accurate latency control of differential serial data output signals generated by the parallel-to-serial converter in accordance with the present invention.

FIG. 14 is a simplified schematic diagram showing a portion of 5 to 1 multiplexer 1400 that was added to the parallel-to-serial data transmitter 1100 depicted in FIG. 11. The 5 to 1 multiplexer 1400 reduced any unpredictable signal delay after the clock controlled converter switch 610 to further optimize and provide accurate latency control associated with the data transmitter 1100. The present inventors found the aforesaid unpredictable signal delay occurring after the switch 610 could be minimized by locking one pulse with the reference clock 1002 via a phase locked loop circuit (depicted in FIGS. and 16 as PLL), thereby allowing the delay between the loading clock pulses 702 and the respective output pulses to be easily predetermined. The present invention is not so limited however, and those skilled in the art will appreciate that many other techniques can also be used to reduce inherent unpredictable signal delays after the clock controlled switch 610. Keeping the foregoing discussion in mind, it is clear the only remaining uncontrolled delay associated with the embodiments disclosed herein above are those inherent delays associated with line drivers, e.g. PECL line drivers (not shown) that may be used with the parallel-to-serial data transmitter 1100. Those skilled in the art readily appreciate that complementary outputs are required for the 5 to 1 multiplexer 1400 to drive a differential PECL line driver. The present inventors were able to use only PMOS switches 1402 at the outputs of the multiplexer 1400 since the input swing necessary to drive the aforesaid differential PECL line driver need not be rail-to-rail. This approach further simplified the multiplexer 1400 architecture so that only negative control pulses were required. The multiplexer 1400 includes a chain of inverters 1404 with a NAND gate 1406 and a NOR gate 1408 added at the front end to allow an external OE signal to put the output into a known state.

Figure 13:
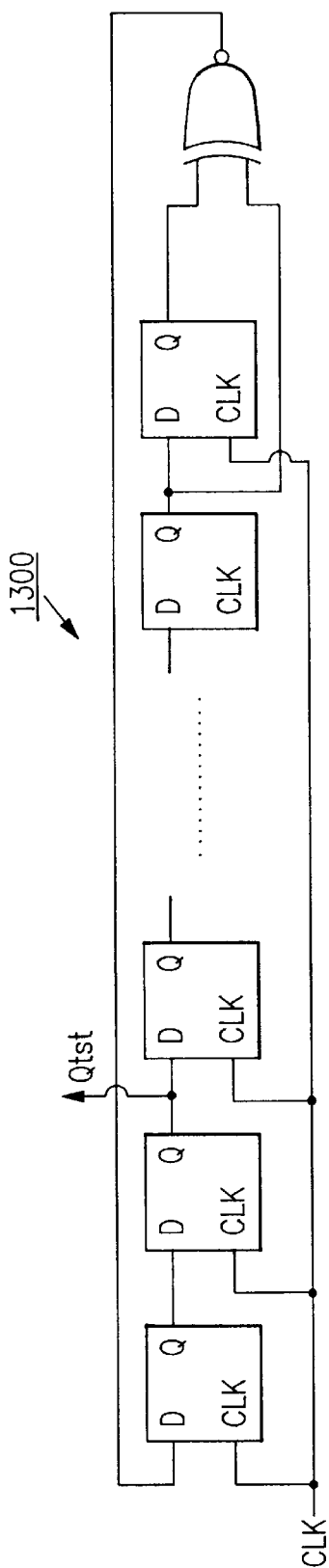
FIG. 13 is a simplified schematic diagram of a pseudo random data generator that was used to perform a SPICE simulation for a series of D Flip-flops depicted in FIG. 12 and found suitable for measuring serial output data pulse delays, rise times and fall times.
Figure 16:
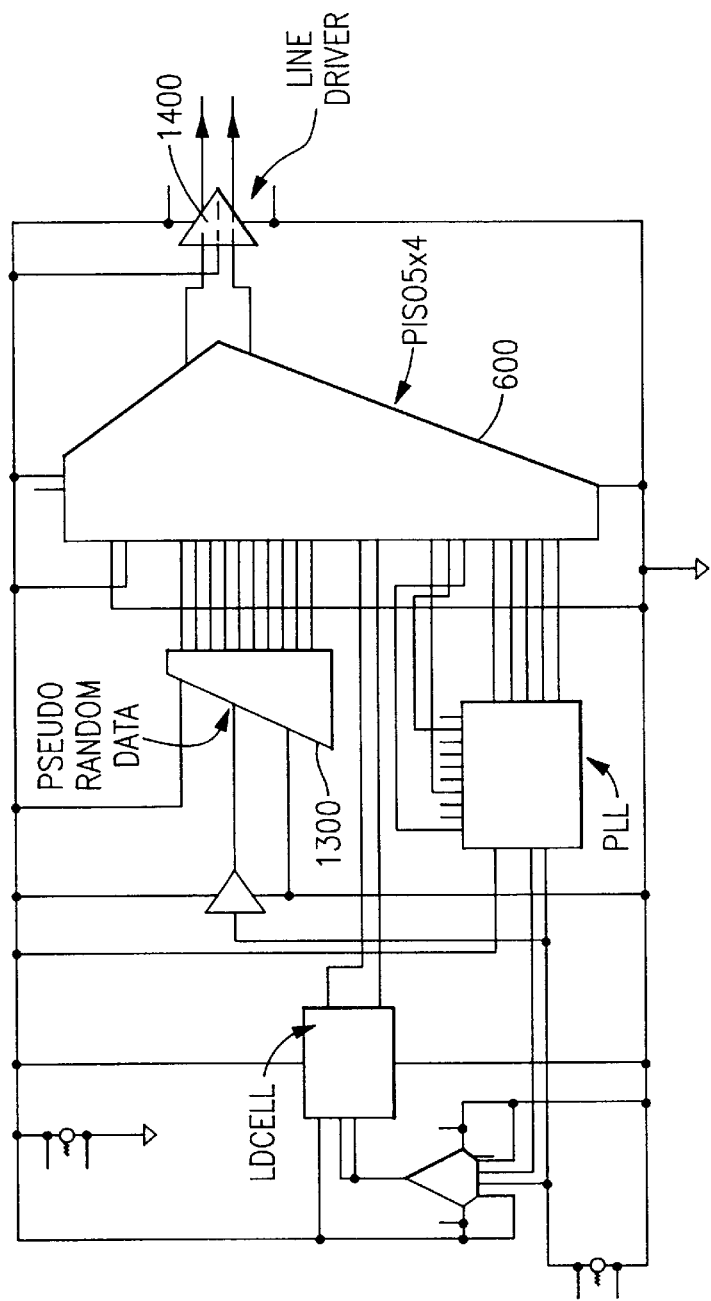
FIG. 16 is the top-level block diagram of the circuit used for SPICE simulation of the parallel-to-serial converter shown in FIG. 15.
Figure 15:
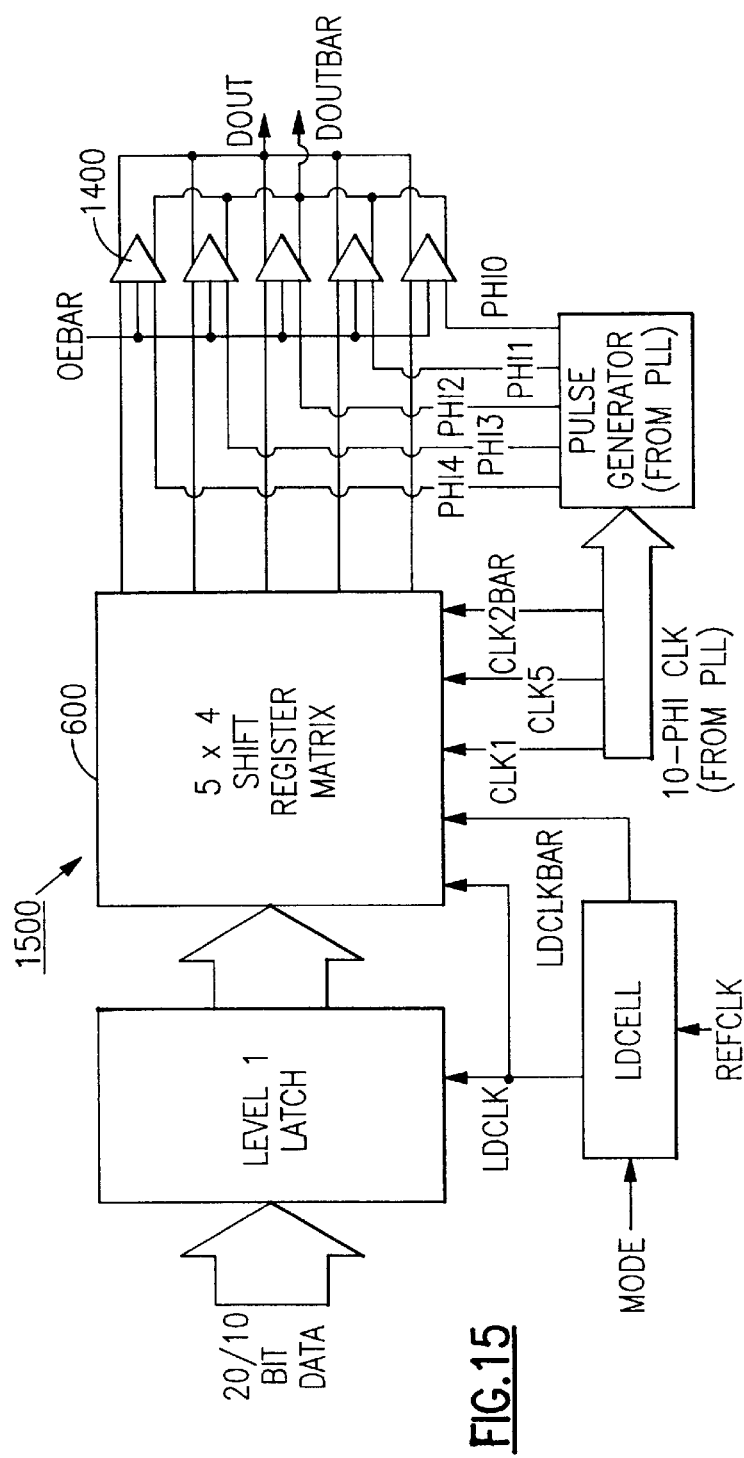
FIG. 15 is a simplified block diagram illustrating one preferred embodiment of a parallel-to-serial data converter in accordance with the present invention utilizing the D Flip-flop matrix shown in FIG. 6 and a plurality of driver stages such as the one shown in FIG. 14.
Figure 17:
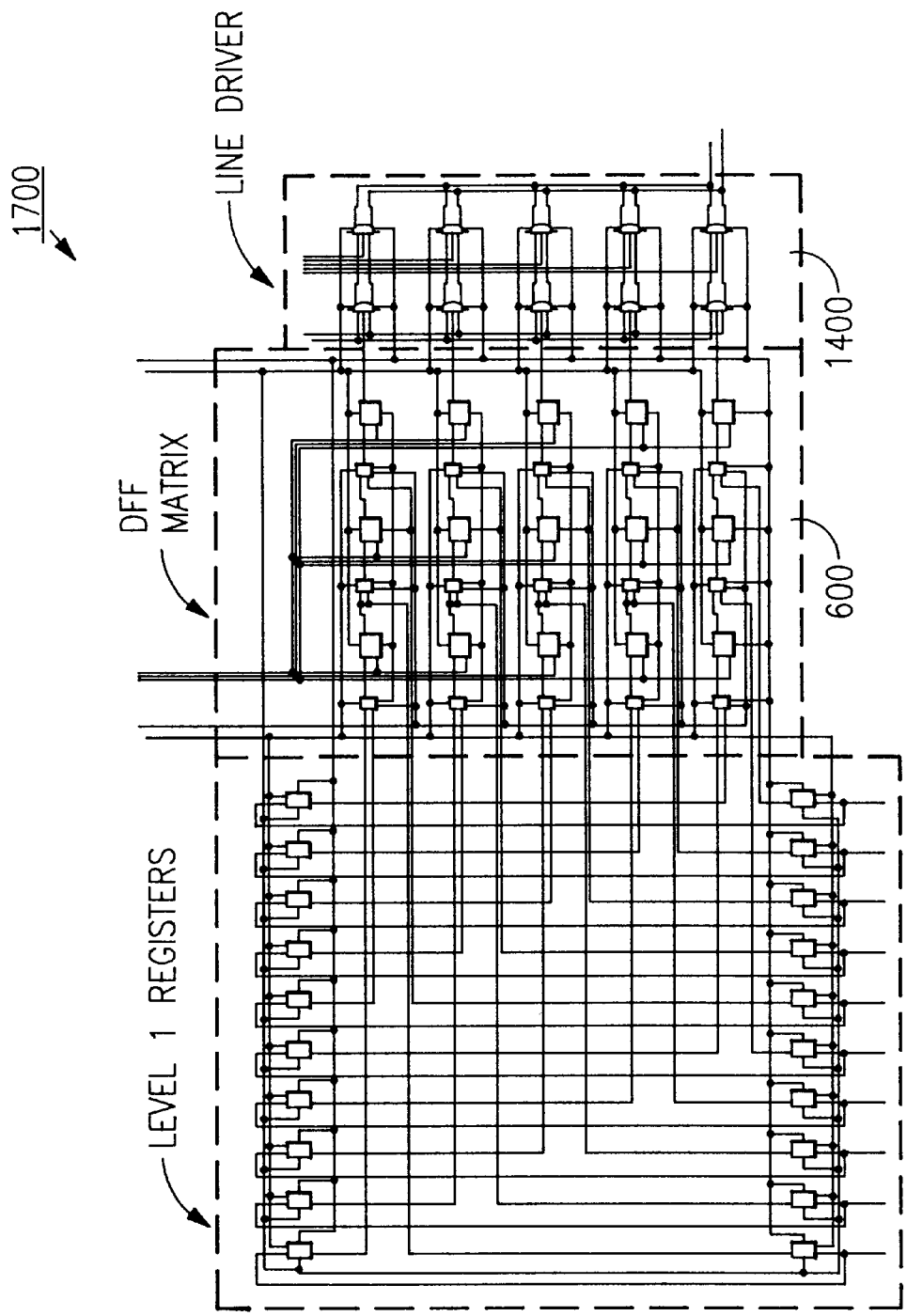
FIG. 17 is a schematic of the circuit used for SPICE simulation of the D Flip-flop matrix, line driver and level 1 registers in accordance with one embodiment of the present parallel-to-serial data converter and used to verify timing and output signal characteristics.

FIG. 15 illustrates one preferred embodiment of a complete parallel-to-serial data transmitter 1500 including a group of multiplexers 1400 coupled to the output of the herein before described 5×4 Shift Register Matrix 600. SPICE simulations, a technique familiar to those skilled in the art of circuit design, were performed on selected portions of the data transmitter 1500 to verify timing relationships between the loading clock pulses 702, shift clock pulses 704, 710, 712 and phase clock pulses 706, 708, 714, 716, 718, on which the herein above referenced pipelined working scheme is applied. With reference to FIG. 16, a top level schematic diagram illustrates a SPICE simulation for a selected portion of the data transmitter 1500 using a pseudo random data generator (enumerated as 1300 in FIG. 13) as a data source. The pseudo random data generator 1300 is simply a signal source having full CMOS logic well known to those skilled in the art of circuit design, and therefore its performance and details shall not be discussed herein to preserve brevity and clarity. FIG. 17 shows a more detailed SPICE simulation developed for a complete parallel-to-serial data converter 1700 that was used to verify the aforesaid timing relationships.

Figure 18:
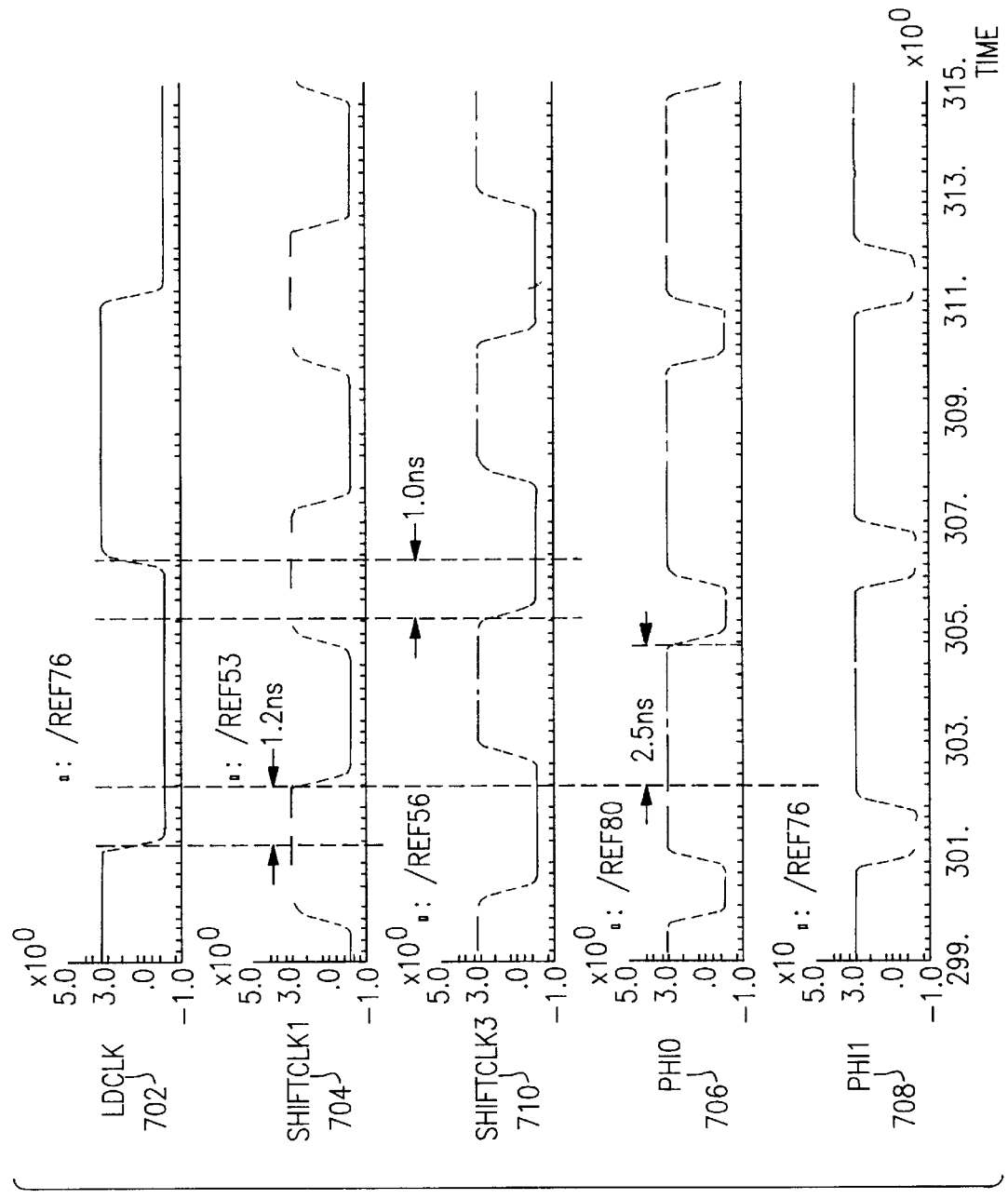
FIG. 18 illustrates the simulated timing relationship between the loading clock, shift clocks and pulses, on which a pipelined working scheme is applied for the simulated parallel-to-serial data converter depicted in FIG. 17.
Figure 19:
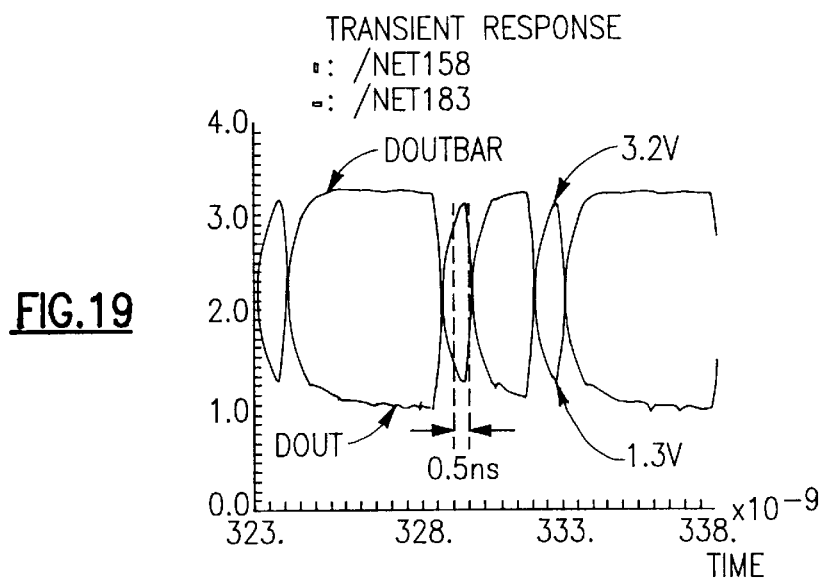
FIG. 19 illustrates the differential serial output for the simulated parallel-to-serial data converter depicted in FIG. 17.

FIG. 18 illustrates the verified timing relationships between selected loading clock pulses 702, shift clock pulses 704, 710 and phase clock pulses 706, 708 generated via the SPICE simulations discussed herein above and depicted in FIGS. 16 and 17; while FIG. 19 illustrates a differential serial output signal transmitted on the output bus to verify the serial data stream signal swing matches the input requirements for a differential line driver. The present inventors performed simulations at 25° C. and 85° C. with similar results. For example, Table III below lists parallel-to-serial converter 1700 measurements of important specifications for data signals obtained at 25° C. for important specifications of interest referenced herein before.

TABLE III

Measured Specifications for Simulated
Parallel-to-Serial Transmitter

| | |
|---|---|
| Power Dissipation (w/o PECL drivers) | 175 mW |
| Bit Latency | 4 ns |
| Rise Time | 0.5 ns |
| Fall Time | 0.5 ns |
| Voltage Swing | 1.2 V–3.2 V (interlaced "0" and "1") |
| | 1.0 V–3.3 V (consecutive "0" or "1") |

Figure 20:
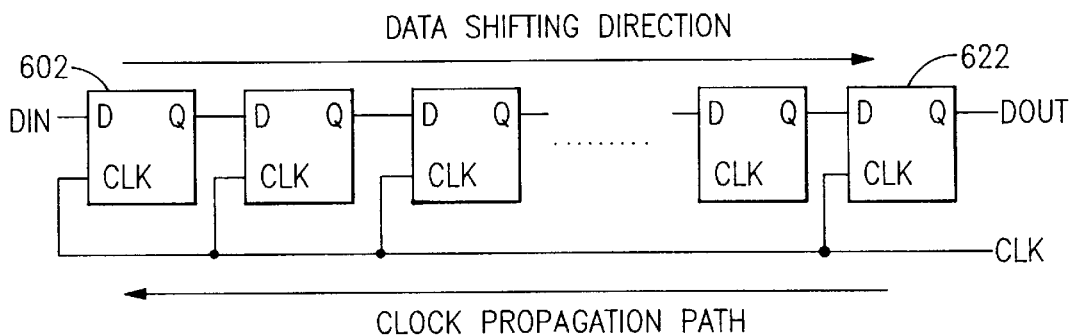
FIG. 20 is a simplified schematic diagram illustrating the clock propagation path used for the serial shifting D Flip-cells to decrease clock skew effects in accordance with one embodiment of the present invention.

Looking again at FIG. 6, it can be seen that four D Flip-flops 602, 622 are triggered by one single clock to perform the requisite shift operation for each data path. The present inventors accomplished the single clock triggering by routing the respective clock line in the direction of last D Flip-flop 622 to first D Flip-flop 602 as shown in FIG. 20. It will be appreciated by those skilled in the art of circuit design that the above described reverse triggering procedure will reduce sensitivity to clock skew between Flip-flop stages. If the clock skew is sufficient, the earlier stage may change and present new data to the input of the later stage before the later Flip-flop receives its clock input, therefore relieving certain layout issues at high speeds.

Figure 21:
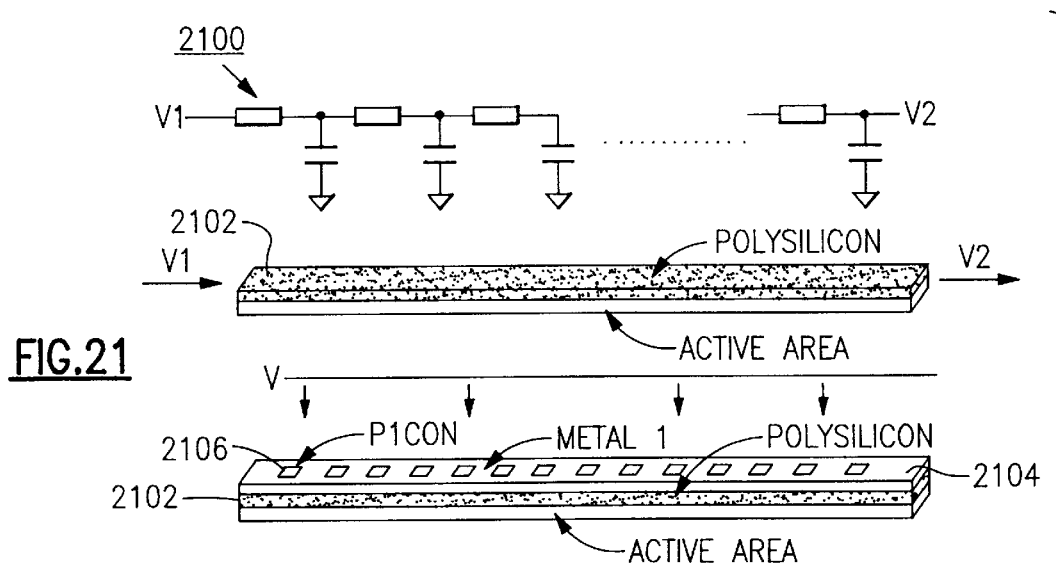
FIG. 21 illustrates a structural technique used to reduce RC delays associated with inherent parasitic capacitances associated with polysilicon structures to achieve high-speed signal propagation for the present invention.
Figure 22:
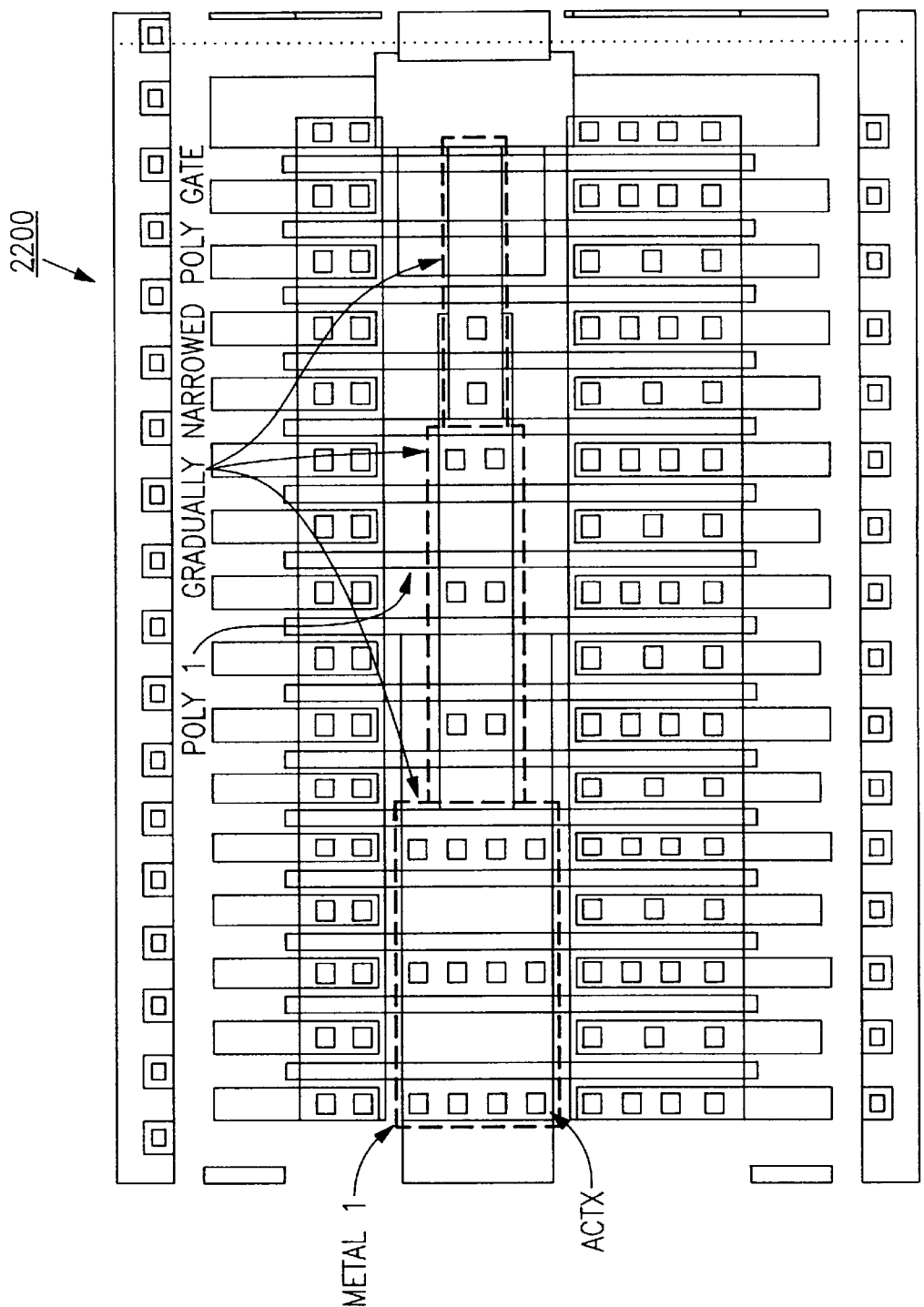
FIG. 22 illustrates a large inverter structure fabricated using the polysilicon structural layout technique depicted in FIG. 21.

Those skilled in the art of high-speed data transmission will readily appreciate the RC delays associated with polysilicon material cannot be neglected, especially for large inverters and pmos multiplexers such as used by the present inventors to fabricate the parallel-to-serial data transmitter 1400 components. FIG. 21 illustrates an approximation model 2100 familiar to those skilled in the art of circuit modeling, and that provides a suitable schematic representation for a length of polysilicon material 2102. It shall be understood that a plurality of fabrication techniques are available for adequately reducing the aforesaid RC delays. The present inventors found it preferable to lay a strip of metal 1 (2104) having a series of evenly spaced polysilicon contacts 2106 directly on top of the polysilicon material 2102. One section of a microchip layout for a large inverter 2200 component that was fabricated in accordance with the above described technique is illustrated in FIG. 22. The width of the polysilicon material 2102 (shown by dash lines) used to fabricate the large inverter 2200 was reduced in the direction of gate charging current to accommodate a gradually reduced average current along the gate of the large inverter 2200. This technique was used by the present inventors to minimize parasitic capacitances associated with the polysilicon and metal 1 structure.

Figure 23:
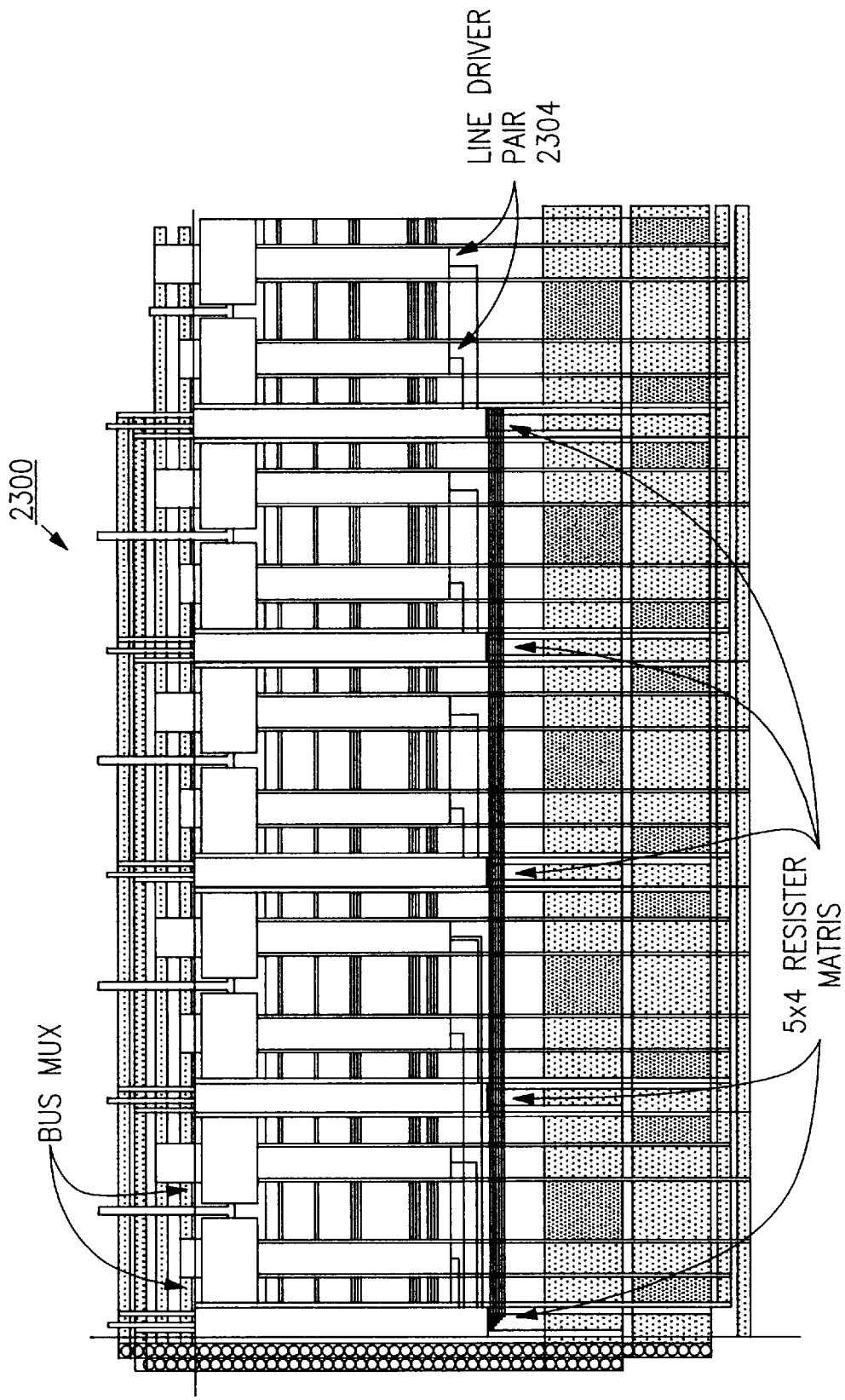
FIG. 23 illustrates one embodiment of a completed structural layout of a portion of the present inventive parallel-to-serial converter.

FIG. 23 illustrates a CMOS microchip cell 2300 layout for the complete parallel-to-serial converter 1500 depicted in FIG. 15. The selected 20/10 bit data inputs go into the cell 2300 from the top and flow down through the 5 data paths 2302, each path 2302 having four serial D Flip-flops. Subsequently, the data passes upward through a line driver pair 2304 to reach the switches 610 (shown in FIG. 6). In a manner familiar to those skilled in the art of CMOS microchip fabrication, wide metal structures were used to accommodate large peak currents in the power supply (not shown) in response to the high rate of output data flowing through the switches 610.

This invention has been described herein in considerable detail in order to provide those skilled in the CMOS art with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

We claim:

1. A CMOS parallel-to-serial data transmitter comprising:
   a D Flip-flop shift register matrix; and
   at least one multi-mode load clock coupled to said shift register matrix, said at least one multi-mode load clock adapted to control data selection and flow into said shift register matrix at a desired frequency selected from a plurality of predetermined operating frequencies upon application of a mode control signal to said at least one multi-mode load clock, wherein said selected operating frequency is dependent upon a state of said mode control signal.

2. The CMOS parallel-to-serial data transmitter of claim 1 further comprising at least one shift clock, wherein said at least one multi-mode load clock is synchronized with said at least one shift clock such that said at least one shift clock selectively serializes flow of said data through said shift register matrix.

3. The CMOS parallel-to-serial data transmitter of claim 2 further comprising at least one output switch coupled to said shift register matrix.

4. The CMOS parallel-to-serial data transmitter of claim 3 further comprising a multi-phase clock, wherein said at least one multi-mode load clock is further synchronized with said multi-phase clock such that said multi-phase clock selectively controls output flow of said data from said shift register matrix through said at least one output switch.

5. The CMOS parallel-to-serial data transmitter of claim 4 wherein said shift register matrix comprises a plurality of true single phase clock D Flip-flops.

6. The CMOS parallel-to-serial data transmitter of claim 5 wherein each true single phase clock D Flip-flop within said plurality of true single phase clock D Flip-flops comprises ratioed logic.

7. The CMOS parallel-to-serial data transmitter of claim 6 further comprising a driver stage coupled to said at least one output switch, wherein said driver stage is adapted to drive a differential line driver.

8. The CMOS parallel-to-serial data transmitter of claim 7 further comprising a level one latch coupled to said shift register matrix, said level one latch adapted to transfer data into said shift register matrix at a rate controlled by said at least one multi-mode load clock.

9. The CMOS parallel-to-serial data transmitter of claim 8 wherein said multi-phase clock comprises a multi-stage ring oscillator, said ring oscillator adapted to generate a reference signal for synchronizing said load clock with said at least one shift clock.

10. The CMOS parallel-to-serial data transmitter of claim 9 further comprising a phase-locked-loop coupled to said driver stage, said phase-locked-loop adapted to control a delay time between a predetermined load clock pulse and a predetermined transmitter output pulse.

11. The CMOS parallel-to-serial data transmitter of claim 10 wherein each said at least one shift clock is adapted to trigger all D Flip-flops in at least one data path such that said all D Flip-flops are triggered in reverse order from output to input of said at least one data path.

12. A CMOS parallel-to-serial data transmitter comprising:
 a D Flip-flop shift register matrix; and
 clocking means coupled to said shift register matrix for controlling data flow through said shift register matrix, said clocking means adapted to operate at a desired clocking rate selected from a plurality of predetermined clocking rates, said clocking means further adapted to selectively vary said clocking rate upon application of a mode control signal to said clocking means.

13. The CMOS parallel-to-serial data transmitter of claim 12 wherein said shift register matrix comprises a plurality of true single phase clock D Flip-flops.

14. The CMOS parallel-to-serial data transmitter of claim 13 wherein each true single phase clock D Flip-flop within said plurality of true single phase clock D Flip-flops comprises logic selected from the group consisting of ratioed and ratioless.

15. The CMOS parallel-to-serial data transmitter of claim 14 further comprising a driver stage coupled to said shift register matrix, wherein said driver stage is adapted to drive a differential line driver.

16. The CMOS parallel-to-serial data transmitter of claim 15 further comprising a phase-locked-loop coupled to said driver stage, said phase-locked-loop adapted to control a delay time between a predetermined load clock pulse and a predetermined transmitter output pulse.

17. The CMOS parallel-to-serial data transmitter of claim 16 further comprising a level one latch coupled to said shift register matrix, said level one latch adapted to transfer data in to said shift register at a rate controlled by said clocking means.

18. The CMOS parallel-to-serial data transmitter of claim 17 wherein said clocking means comprises at least one load clock.

19. The CMOS parallel-to-serial data transmitter of claim 18 wherein said clocking means further comprises at least one shift clock.

20. The CMOS parallel-to-serial data transmitter of claim 19 wherein said clocking means further comprises at least one phase clock.

21. The CMOS parallel-to-serial data transmitter of claim 20 wherein said at least one phase clock comprises a ring oscillator, said ring oscillator adapted to generate a reference signal for synchronizing said at least one load clock with said at least one phase clock.

22. A CMOS parallel-to-serial data converter comprising:
 a plurality of D Flip-flops arranged to form a shift register matrix;
 a plurality of multiplexers adapted to select and steer data flowing through said plurality of D Flip-flops;
 a plurality of output switches coupled to said shift register matrix;
 at least one load clock adapted to control data flowing through said plurality of multiplexers such that said data flows through said plurality of multiplexers at a first predetermined data rate, said load clock further adapted to alter said data rate upon application of a mode control signal to said load clock;
 at least one shift clock adapted to control data flowing through said plurality of D Flip-flops such that said data flows through said plurality of D Flip-flops at a second predetermined data rate; and
 a plurality of phase clocks adapted to control data flowing through said output switches such that said data flowing through said plurality of D Flip-flops can be pipelined onto a data bus.

23. The CMOS parallel-to-serial data converter of claim 22 wherein said plurality of D Flip-flops are comprised of true single phase clock Flip-flops.

24. The CMOS parallel-to-serial data converter of claim 23 wherein each true single phase clock Flip-flop comprises logic selected from the group consisting of ratioed and ratioless.

25. The CMOS parallel-to-serial data converter of claim 24 wherein said plurality of phase clocks comprise a multi-stage ring oscillator.

26. The CMOS parallel-to-serial data converter of claim 25 wherein said multi-stage ring oscillator is adapted to generate a reference signal for synchronizing said at least one load clock with said at least one shift clock.

27. The CMOS parallel-to-serial data converter of claim 26 wherein each said at least one shift clock is adapted to trigger all D Flip-flops in at least one data path such that said all D Flip-flops in said at least one data path are triggered in reverse order from output to input of said at least one data path.

28. A method of converting parallel data to serial data in a CMOS D Flip-flop shift register matrix having a plurality of multiplexers, at least one load clock, at least one shift clock, and at least one multi-phase clock, said method comprising the steps of:
 loading a parallel data word having a first fixed bit width determined by a first group of parallel bits into said shift register matrix at a first clocking frequency determined by said at least one load clock;

shifting each bit within said first group of parallel bits through said shift register matrix from input to output at a clocking frequency determined by said at least one shift clock; and sequentially selecting each bit shifted through said shift register matrix such that each said selected bit can be pipelined onto a data bus at a clocking frequency determined by said at least one multi-phase clock, to serially transmit said parallel data word having a first fixed bit width.

29. The method of claim 28 further comprising the step of:

loading a second parallel data word having a second fixed bit width determined by a second group of parallel bits into said shift register matrix at a second clocking frequency determined by said at least one load clock;

shifting each bit within said second group of parallel bits through said shift register matrix from input to output at a clocking frequency determined by said at least one shift clock; and sequentially selecting each bit shifted through said shift register matrix such that each selected bit can be pipelined onto a data bus at a clocking frequency determined by said at least one multi-phase clock, to serially transmit said second parallel data word having a second fixed bit width.

\* \* \* \* \*